United States Patent
Berzins et al.

(10) Patent No.: US 10,607,982 B2
(45) Date of Patent: Mar. 31, 2020

(54) LAYOUT CONNECTION ISOLATION TECHNIQUE FOR IMPROVING IMMUNITY TO JITTER AND VOLTAGE DROP IN A STANDARD CELL

(71) Applicant: Samsung Electronics Co., Ltd., Suwon-si, Gyeonggi-do (KR)

(72) Inventors: Matthew Berzins, Cedar Park, TX (US); Charles A. Cornell, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 16/150,249

(22) Filed: Oct. 2, 2018

(65) Prior Publication Data

US 2020/0020678 A1 Jan. 16, 2020

Related U.S. Application Data

(60) Provisional application No. 62/696,328, filed on Jul. 10, 2018.

(51) Int. Cl.
| | |
|---|---|
| *H01L 23/52* | (2006.01) |
| *H01L 27/02* | (2006.01) |
| *H03K 19/003* | (2006.01) |
| *H01L 23/522* | (2006.01) |
| *H01L 23/528* | (2006.01) |

(52) U.S. Cl.
CPC ...... *H01L 27/0207* (2013.01); *H01L 23/5228* (2013.01); *H01L 23/5286* (2013.01); *H03K 19/003* (2013.01)

(58) Field of Classification Search
CPC . H01L 27/02; H01L 27/0207; H01L 23/5228; H01L 23/5286; H03K 19/003
See application file for complete search history.

(56) References Cited

U.S. PATENT DOCUMENTS

| | | |
|---|---|---|
| 7,217,963 B2 | 5/2007 | Kanno et al. |
| 7,471,580 B2 | 12/2008 | Henzler et al. |
| 8,456,223 B2 | 6/2013 | Myers et al. |
| 8,633,774 B2 | 1/2014 | Wood |
| 8,723,268 B2 | 5/2014 | Moroz et al. |
| 9,391,017 B2 | 7/2016 | Utsumi |
| 9,892,224 B2 | 2/2018 | Lin et al. |
| 9,941,887 B2 | 4/2018 | Wang |

(Continued)

*Primary Examiner* — Phuc T Dang
(74) *Attorney, Agent, or Firm* — Renaissance IP Law Group LLP

(57) ABSTRACT

A standard cell architecture provides an improved immunity to power-supply voltage-drop, does not induce power-supply voltage drop on a continuous-row power rail of a standard cell, and maintains standard-cell environment compatibility. A circuit includes a first metal layer and a second metal layer that are formed different distances above a substrate. At least one first standard cell drives a first timing signal and includes at least one transistor receiving power from a first power rail in the first metal layer. At least one second standard cell drives a second timing signal and includes at least one transistor receiving power from a second power rail in the second metal layer. The second power rail has both a low peak noise level and a resistance that is lower than that of the first metal layer.

15 Claims, 4 Drawing Sheets

(56) References Cited

U.S. PATENT DOCUMENTS

| | | | |
|---|---|---|---|
| 2008/0143436 A1* | 6/2008 | Xu | H03F 3/217 330/10 |
| 2009/0212327 A1* | 8/2009 | Kim | G06F 17/5045 257/202 |
| 2012/0249182 A1* | 10/2012 | Sherlekar | G06F 17/5077 326/101 |
| 2016/0034627 A1* | 2/2016 | Cho | G06F 17/505 716/104 |
| 2017/0110650 A1* | 4/2017 | Park | H01L 43/02 |
| 2017/0294448 A1* | 10/2017 | Debacker | H01L 27/11807 |

* cited by examiner

LAYOUT CONNECTION ISOLATION TECHNIQUE FOR IMPROVING IMMUNITY TO JITTER AND VOLTAGE DROP IN A STANDARD CELL

CROSS-REFERENCE TO RELATED APPLICATION

This patent application claims the priority benefit under 35 U.S.C. § 119(e) of U.S. Provisional Patent Application No. 62/696,328, filed on Jul. 10, 2018, the disclosure of which is incorporated herein by reference in its entirety.

TECHNICAL FIELD

The subject matter disclosed herein generally relates to a technique to reduce clock jitter in a standard-cell layout caused by Instantaneous Voltage Drop (IVD) or Dynamic Voltage Drop (DVD).

BACKGROUND

As dimensions of components decrease in integrated circuits, the resistance of connections in metal layers of an integrated circuit correspondingly increases resulting in a significant IVD/DVD for large drive-strength cells. An aspect of particular concern relates to distribution of a global clock in which large drive-strength standard cells are used for efficient clock-signal transport over large distances.

If the power and ground connections of the large clock cells are to the same metal power mesh as the surrounding standard cell logic gates, any IVD/DVD induced in the power mesh by the clock driver may be experienced by the surrounding logic gates, and vice versa.

SUMMARY

An example embodiment provides a circuit having a standard cell architecture in which the circuit may include a first metal layer, a second metal layer, at least one first standard cell, and at least one second standard cell. The first metal layer may be formed a first distance above a substrate. The second metal layer may be formed a second distance above the substrate in which the second distance may be different from the first distance. The at least one first standard cell may drive a first timing signal in which the at least one first standard cell may include at least one transistor receiving power from a first power rail in the first metal layer. The at least one second standard cell may drive a second timing signal, and the at least one second standard cell may include at least one transistor receiving power from a second power rail in the second metal layer. In one embodiment, the second power rail in the second metal layer may include a noise level of less than about 20 mV peak. In another embodiment, the first metal layer may include a first resistance and the second metal layer may include a second resistance that is less than the first resistance. In one embodiment, the second distance may be greater than the first distance.

Another example embodiment provides a circuit having a standard cell architecture in which the circuit may include a first metal layer, a second metal layer, at least one first clock driver and at least one second clock driver. The first metal layer may be formed a first distance above a substrate, and the second metal layer may be formed a second distance above the substrate in which the second distance may be different from the first distance.

The at least one first clock driver may be formed from a first standard cell that drives a first timing signal and in which the at least one first clock driver may include at least one transistor receiving power from a first power rail in the first metal layer.

The at least one second clock driver may be formed from a second standard cell that drives a second timing signal, and in which the at least one second clock driver may include at least one transistor receiving power from a second power rail in the second metal layer. In one embodiment, the second power rail in the second metal layer may include a noise level of less than about 20 mV peak. In another embodiment, the first metal layer may include a first resistance and the second metal layer may include a second resistance that is less than the first resistance.

In one embodiment, the second distance may be greater than the first distance.

Still another example embodiment provides a circuit having a standard cell architecture in which the circuit may include a first metal layer, a second metal layer, at least one first standard cell, and at least one second standard cell. The first metal layer may be formed a first distance above a substrate and in which the first metal layer may include a first resistance. The second metal layer may be formed a second distance above the substrate in which the second distance may be different from the first distance, in which the second metal layer may include a second resistance that is less than the first resistance, and in which the second metal layer may include a noise level of less than 50 mV peak. The at least one first standard cell may drive a first timing signal and in which the at least one first standard cell may include at least one transistor receiving power from a first power rail in the first metal layer. The at least one second standard cell may drive a second timing signal, and in which the at least one second standard cell may include at least one transistor receiving power from a second power rail in the second metal layer.

In one embodiment, the second metal layer further may include a noise level of less than about 20 mV peak. In one embodiment, the second distance may be greater than the first distance.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

Figure 1:
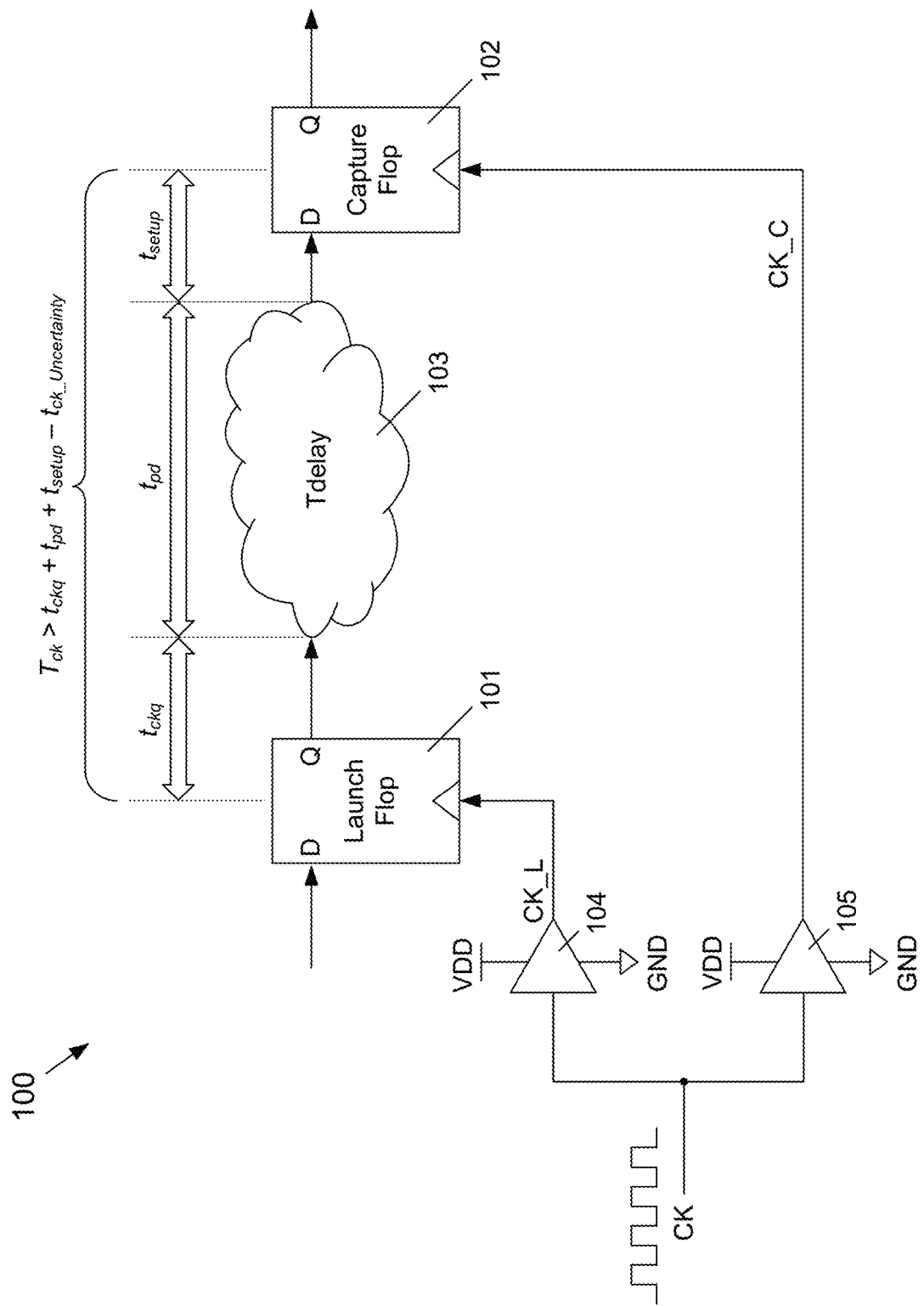
FIG. 1 depicts an example circuit in which timing may be improved by the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein provides a technique that reduces clock uncertainty. In one embodiment, a standard-cell architecture is provided that has an improved immunity to power-supply voltage-drop, does not induce power-supply voltage drop on a continuous-row power rail of a standard cell, and maintains standard-cell environment compatibility. In one embodiment, an isolated and dedicated power rail is provided in a standard cell layout that connects to a low-noise, low-resistance power plane through a via stack. The low-noise, low-resistance power plane may be located higher above the substrate than the continuous-row power rail.

One embodiment provides dedicated power and ground connections for a clock driver of a standard cell layout that may be isolated from a surrounding power mesh in which the power nodes of the clock driver may be connected to low-resistance metal layers having a noise level that is lower than the surrounding power mesh connected to the continuous-row power rail. In one embodiment, the low-resistance metal layers may be located at a relatively high layer from the substrate and may be connected to the power nodes of the clock driver through a via stack.

FIG. 1 depicts an example circuit 100 in which timing may be improved by the subject matter disclosed herein. The example circuit 100 includes a launch flip-flop (flop) 101, a capture flip-flop 102, and a combination logic circuit 103 between the launch flip-flop 101 and the capture flip-flop 102. A clock signal CK is input to a first clock driver 104 and a second clock driver 105. The first clock driver 104 outputs a CL_L clock signal that is input to the launch flip-flop 101. The second clock driver 105 outputs a CK_C clock signal that is input to the capture flip-flop 102.

It is generally desirable to achieve higher clock frequencies in mobile applications. If, however, the launch flip-flop 101 has relatively short clock-to-Q delay ($t_{ckq}$), the capture flip-flop 102 has reduced setup delay ($t_{setup}$), and the delay ($t_{pd}$) of the combination logic circuit 103 is fixed, then the uncertainty associated with the CK_L and the CK_C clock signals will need to be reduced to provide an improved (i.e., a higher) clock frequency. The uncertainty associated with the clock signals, also commonly referred to as clock jitter, may cause a skew, or an uncertain arrival time, of a clock compared to its ideal causal point. Clock uncertainty and resulting skew may be caused by many non-ideal factors such as, but not limited to, local random transistor variation, routing variation, coupling or other noise, electromagnetic interference (EMI), and/or IVD/DVD conditions.

If the example circuit 100 in FIG. 1 were an ideal circuit, the CK_C and CK_L clock-signal paths would having identical clock drivers, identical signal-path routes and ideal connections to power supplies so that the CK_C and CK_L clock signals would arrive at their destinations at identical times and with no clock jitter.

If, for example, the CK_L clock signal arrives at the launch flip-flop 101 late caused by a local power supply voltage drop (i.e., IVD/DVD) on the power supply of the CK_L clock driver 104 that the CK_C clock driver 105 does not experience, then the frequency of the circuit 100 would be reduced by the difference in time the respective clock signals CK_L and CK_C arrive at the flip-flops 101 and 102.

The period $T_{ck}$ of the clock should be $$T_{ck} \geq t_{ckq} + t_{pd} + t_{setup} - t_{ck\_uncertainty} \qquad (1)$$

in which $t_{ckq}$ is the clock-to-Q delay time for the launch flip-flop 101, $t_{pd}$ is the propagation delay through the combination logic circuit 103, $t_{setup}$ is the setup time for the capture flip-flop 102, and $t_{ck\_uncertainty}$ is the uncertainty caused IVD/DVD conditions. Although $t_{ck\_uncertainty}$ may be caused by other non-ideal factors, as previously described, the focus of the subject matter disclosed herein relates to reducing clock jitter caused by IVD/DVD conditions, so $t_{ck\_uncertainty}$ as used herein refers time uncertainty caused by IVD/DVD conditions.

In a worst case scenario, if the CK_L clock signal arrives at the launch flip-flop 101 early due to a local voltage rise on the CK_L driver, and if the CK_C clock signal arrives late at the capture flip-flop 102 caused by a voltage drop (i.e., an IVD/DVD) on CK_C driver, it is possible for the launch data to arrive in the hold timing window of the capture flop 102, which may cause a capture-hold violation resulting in a chip failure.

Figure 2A:
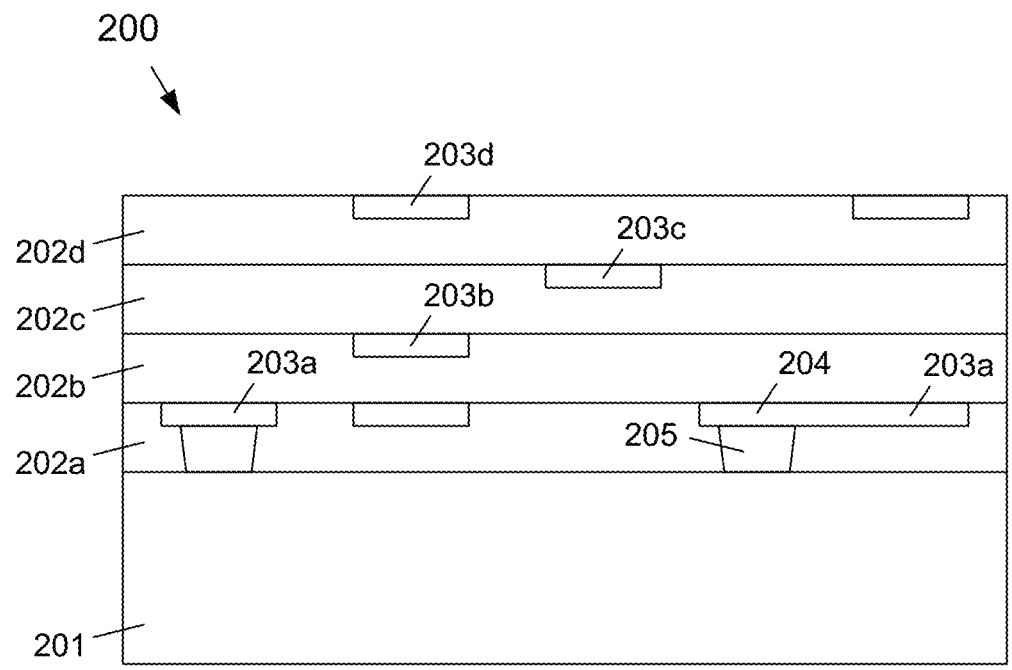
FIG. 2A depicts a cross-sectional view of a typical power connection to a clock driver of a standard cell layer.

FIG. 2A depicts a cross-sectional view of a typical power connection to a clock driver of a standard cell layer 200. The standard cell layer 200 may include a substrate 201, a plurality of inter-insulating layers 202a-202d, and a plurality of metal layers 203a-203d that may be respectively formed in the inter-insulating layers. A power connection 204 to a power supply mesh in a metal layer 203a may be formed between a clock driver (not shown) in the substrate 201 through a via 205. Typically, the power connection 204 is to a continuous power rail for a standard cell. The power mesh 204 may typically have between 70 mV peak noise to 130 mV peak of noise, which may significantly contribute to $t_{ck\_uncertainty}$.

Figure 2B:
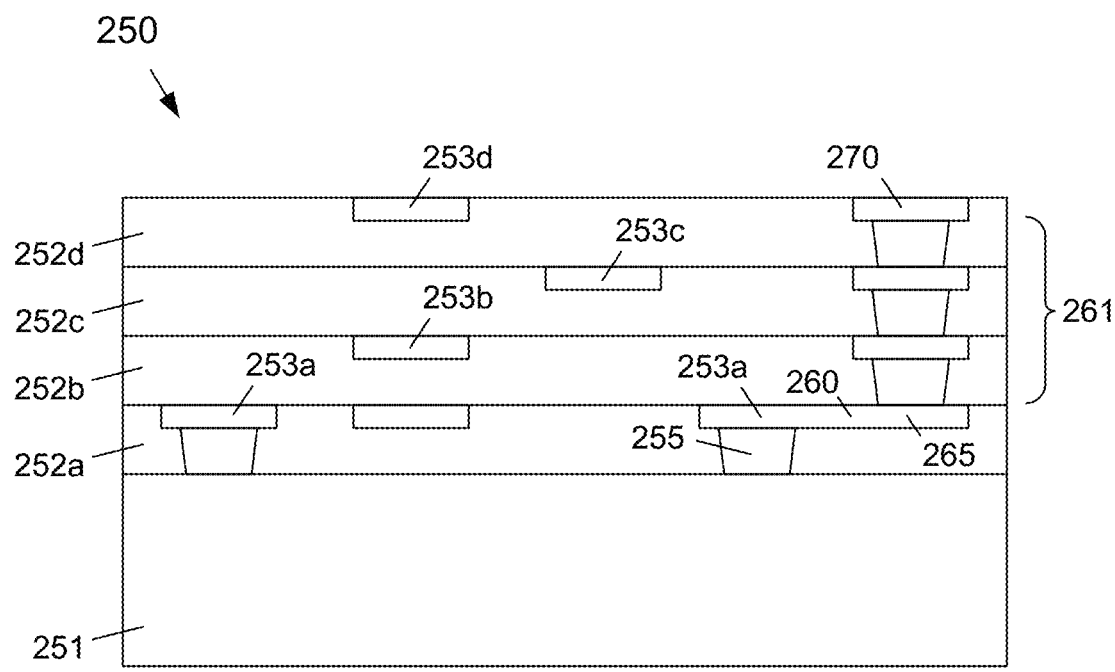
FIG. 2B depicts a cross-sectional view of a power connection to a clock driver of a standard cell layer according to the subject matter disclosed herein.

FIG. 2B depicts a cross-sectional view of a power connection to a clock driver of a standard cell layer 250 according to the subject matter disclosed herein. The standard cell layer 250 may include a substrate 251, a plurality of inter-insulating layers 252a-252d, and a plurality of metal layers 253a-253d that may be respectively formed in the inter-insulating layers. A power connection 260 to a dedicated and isolated power supply rail 265 may be formed between a clock driver (not shown) in the substrate 251 and a metal layer 253a through a via 255. The power connection 260 may also include a via stack 261 between the power supply rail 265 and a power supply metal layer 270. The power supply metal layer 270 may have a resistance that is less than the resistance of the metal layer 253a, which may be substantially equal to the resistance of the metal layer 203a. In one embodiment, the power supply metal layer 270 may have a peak noise level of less than about 50 mV. In another embodiment, the power supply metal layer 270 may have a peak noise level of less than about 20 mV. Although the power supply metal layer 270 depicted in FIG. 2B is depicted as being located four metal layers above the substrate 251, it should be understood that the power supply metal layer 270 may be located any distance above the substrate 251. Additionally, it should be understood that there may be components in the standard cell 250 of FIG. 2B that may include connections to a power mesh, such as the power mesh 204 of FIG. 2A. That is, the cross-section view of FIG. 2A may be another part of the standard cell 250 of FIG. 2B. The power connections 260 may be made to circuit components, such as clock drivers, that would benefit from low clock jitter.

Figure 3A:
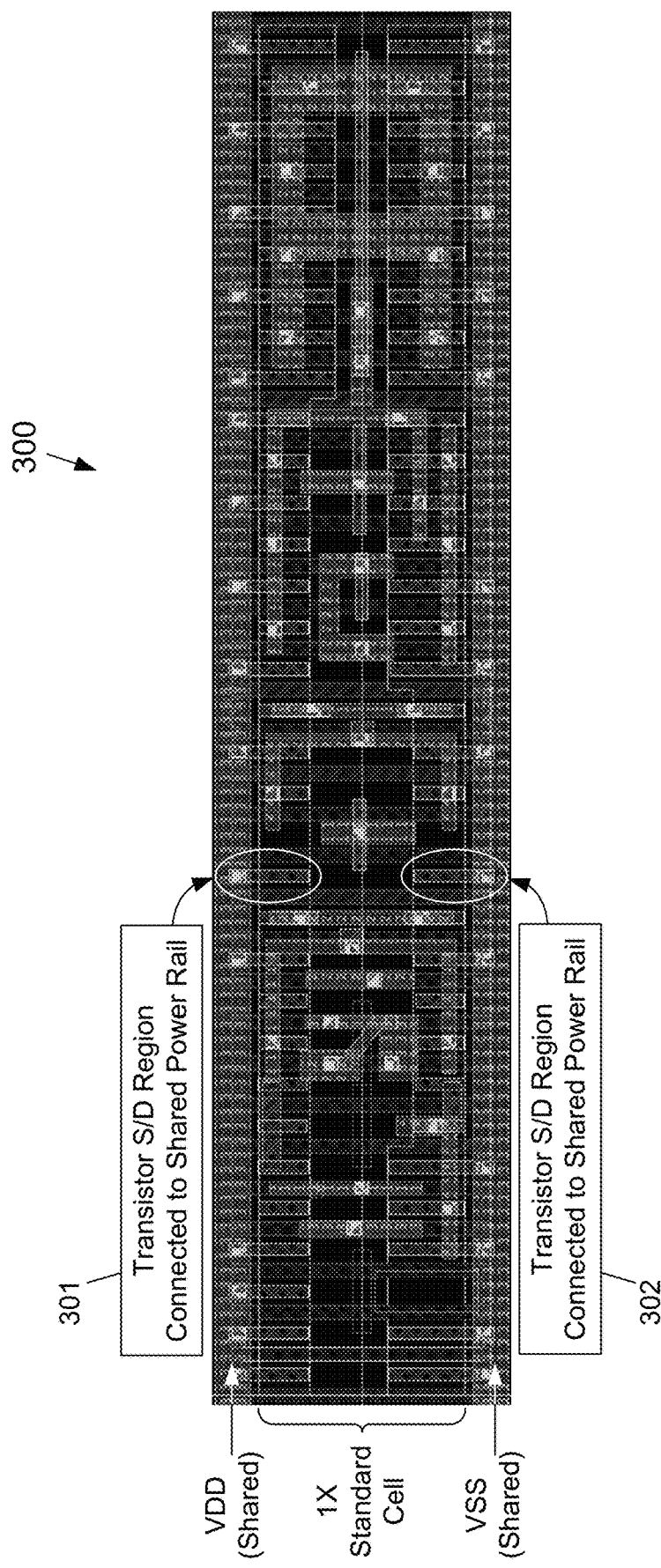
FIG. 3A depicts a plan view of a typical standard cell layout that includes a clock driver connected to a shared power mesh.

FIG. 3A depicts a plan view of a typical standard cell layout 300 that includes a clock driver connected to a shared power mesh. The power mesh includes a continuous VDD rail located at the top of FIG. 3A and a continuous VSS rail located at the bottom of FIG. 3A. The source/drain regions of the clock driver include power connections to the shared power mesh, which are indicated in FIG. 3A at 301 and 302.

Figure 3B:
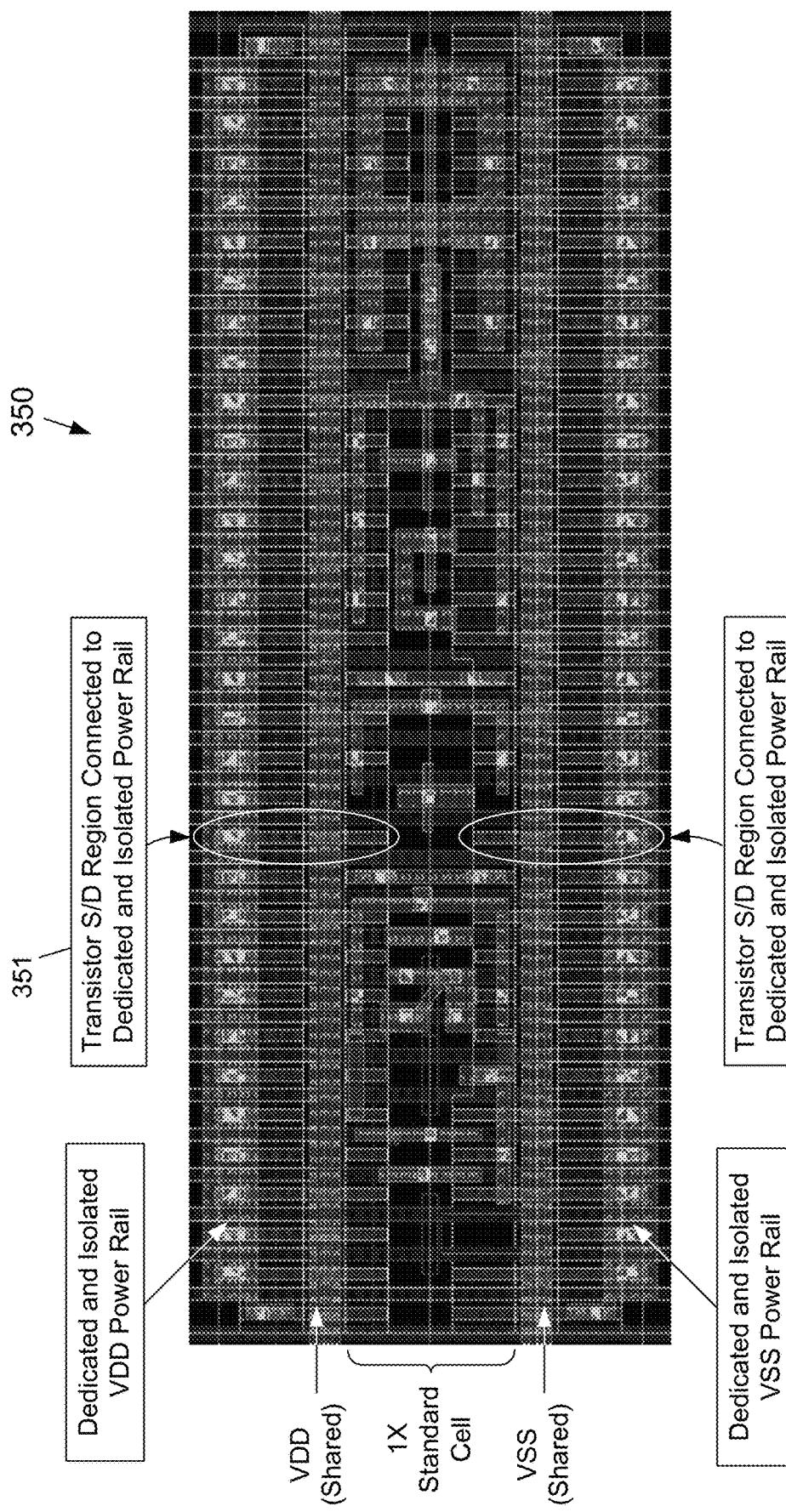
FIG. 3B depicts a plan view of a standard cell layout that includes a clock driver connected to an isolated and dedicated power rails and according to the subject matter disclosed herein.

FIG. 3B depicts a plan view of a standard cell layout 350 that includes a clock driver connected to an isolated and dedicated power rails 351 and 352 according to the subject matter disclosed herein. The metal layers of the dedicated and isolated power supply rails 351 and 352 may have a resistance (a second resistance) that is less than the resistance of the shared power supply rail layers (i.e., the power mesh layers of FIG. 3A). In one embodiment, the dedicated and isolated power supply rails 351 and 352 layers may have a peak noise level of less than about 50 mV. In another embodiment, the dedicated and isolated power supply rails 351 and 352 layers may have a peak noise level of less than about 20 mV.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A circuit having a standard cell architecture, the circuit comprising:
   a first metal layer formed a first distance above a substrate;
   a second metal layer formed a second distance above the substrate, the second distance being greater than the first distance;
   a third power rail at a distance above the substrate that is substantially equal to the first distance, the third power rail being electrically connected to the second power rail through at least one via;
   at least one first standard cell that drives a first timing signal, the at least one first standard cell comprising at least one transistor receiving power from a first power rail in the first metal layer; and
   at least one second standard cell that drives a second timing signal, the at least one second standard cell comprising at least one transistor receiving power from a second power rail in the second metal layer, and the at least one second standard cell being connected to the second power rail through the third power rail.

2. The circuit of claim 1, wherein the second power rail in the second metal layer comprises a noise level of less than about 20 mV peak.

3. The circuit of claim 2, wherein the first metal layer comprises a first resistance and the second metal layer comprises a second resistance that is less than the first resistance.

4. The circuit of claim 1, wherein the first metal layer comprises a first resistance and the second metal layer comprises a second resistance that is less than the first resistance.

5. The circuit of claim 4, wherein the second power rail in the second metal layer comprises a noise level of less than about 20 mV peak.

6. The circuit of claim 5, wherein the at least one first standard cell comprises a first clock driver, and the at least one second standard cell comprises a second clock driver.

7. A circuit having a standard cell architecture, the circuit comprising:
   a first metal layer formed a first distance above a substrate;
   a second metal layer formed a second distance above the substrate, the second distance being greater than the first distance;
   a third power rail at a distance above the substrate that is substantially equal to the first distance, the third power rail being electrically connected to the second power rail through at least one via;

at least one first clock driver formed from a first standard cell that drives a first timing signal, the at least one first clock driver comprising at least one transistor receiving power from a first power rail in the first metal layer; and at least one second clock driver formed from a second standard cell that drives a second timing signal, the at least one second clock driver comprising at least one transistor receiving power from a second power rail in the second metal layer, and the at least one second clock driver being connected to the second power rail through the third power rail.

8. The circuit of claim 7, wherein the second power rail in the second metal layer comprises a noise level of less than about 20 mV peak.

9. The circuit of claim 8, wherein the first metal layer comprises a first resistance and the second metal layer comprises a second resistance that is less than the first resistance.

10. The circuit of claim 7, wherein the first metal layer comprises a first resistance and the second metal layer comprises a second resistance that is less than the first resistance.

11. The circuit of claim 10, wherein the second power rail in the second metal layer comprises a noise level of less than about 20 mV peak.

12. A circuit having a standard cell architecture, the circuit comprising:

a first metal layer formed a first distance above a substrate, the first metal layer comprising a first resistance;

a second metal layer formed a second distance above the substrate, the second distance being different from the first distance, the second metal layer comprising a second resistance that is less than the first resistance and the second metal layer comprises a noise level of less than 50 mV peak;

a third power rail at a distance above the substrate that is substantially equal to the first distance, the third power rail being electrically connected to the second power rail through at least one via;

at least one first standard cell that drives a first timing signal, the at least one first standard cell comprising at least one transistor receiving power from a first power rail in the first metal layer; and at least one second standard cell that drives a second timing signal, the at least one second standard cell comprising at least one transistor receiving power from a second power rail in the second metal layer, and the at least one second standard cell being connected to the second power rail through the third power rail.

13. The circuit of claim 12, wherein the second metal layer further comprises a noise level of less than about 20 mV peak.

14. The circuit of claim 12, wherein the second distance is greater than the first distance.

15. The circuit of claim 14, wherein the at least one first standard cell comprises a first clock driver, and the at least one second standard cell comprises a second clock driver.

* * * * *